(12) United States Patent
Takeuchi et al.

(10) Patent No.: US 7,067,912 B2
(45) Date of Patent: Jun. 27, 2006

(54) WIRED CIRCUIT BOARD

(75) Inventors: Yoshihiko Takeuchi, Osaka (JP); Yasuhito Ohwaki, Osaka (JP); Yuichi Takayoshi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/860,493

(22) Filed: Jun. 4, 2004

(65) Prior Publication Data

US 2004/0245619 A1     Dec. 9, 2004

(30) Foreign Application Priority Data

Jun. 4, 2003    (JP) .............................. 2003-160130

(51) Int. Cl.
   *H01L 23/48*    (2006.01)
   *H01L 23/02*    (2006.01)
   *H01L 23/04*    (2006.01)
   *H05K 1/03*     (2006.01)

(52) U.S. Cl. .................... 257/688; 257/688; 257/699; 257/686; 174/255

(58) Field of Classification Search ................ 257/688; 361/784, 790
See application file for complete search history.

(56) References Cited

U.S. PATENT DOCUMENTS

| | | | |
|---|---|---|---|
| 5,093,761 A * | 3/1992 | Ozaki ......................... | 361/792 |
| 5,592,365 A * | 1/1997 | Sugimoto et al. ........... | 361/789 |
| 5,712,749 A | 1/1998 | Gustafson | |
| 5,961,334 A * | 10/1999 | Inaba .......................... | 439/67 |
| 6,388,201 B1 * | 5/2002 | Yamato et al. .............. | 174/255 |
| 6,797,888 B1 * | 9/2004 | Ookawa et al. ............. | 174/255 |
| 2002/0007961 A1 * | 1/2002 | Yamato et al. .............. | 174/250 |

* cited by examiner

Primary Examiner—Nathan J. Flynn
Assistant Examiner—Benjamin P. Sandvik
(74) Attorney, Agent, or Firm—Jean C. Edwards, Esq.; Akerman Senterfitt (57) ABSTRACT

A wired circuit board can control characteristic impedance at connection points between wires of a suspension board with circuit and terminal portions of the wired circuit board connected thereto with a simple structure, to improve signal transmission efficiency even for fine pitch wiring or for high frequency signals. The wired circuit board includes a relay flexible wiring circuit board formed by a first wired circuit board including a first metal substrate, a first insulating base layer, a first conductor layer and a first insulating cover layer which is substantially identical in layer structure with the suspension board with circuit and a second wired circuit board connected with the first wired circuit board for connecting with a control circuit board. Since the suspension board with circuit and the first wired circuit board are rendered substantially identical in layer structure, both characteristic impedances at these connection points can be matched.

5 Claims, 7 Drawing Sheets

WIRED CIRCUIT BOARD

This application claims priority from Japanese Patent Application No. 2003-160130, filed Jun. 4, 2003, the entire contents of which are herein incorporated by reference to the extent allowed by law.

BACKGROUND OF THE INVENTION

1. Field of the Invention

The present invention relates to a wired circuit board to connect with a suspension board with circuit equipped with a magnetic head of a hard disk drive.

2. Description of the Prior Art

In the hard disk drive, the suspension board with circuit equipped with the magnetic head usually has lines for transmitting read signals and write signals to the magnetic head. These lines are connected to terminal portions of the wired circuit board equipped with an electronic device such as a preamplifier IC. The signals from the lines are amplified by the electronic device such as the preamplifier IC placed on the wired circuit board and then transmitted from the wired circuit board to a control circuit board for controlling the magnetic head.

Meanwhile, along with improvement in recent years to fine pitch wiring and to high frequency signal, it is increasingly becoming necessary to control characteristic impedances at connection points between the lines of the suspension board with circuit and the terminal portions of the wired circuit board connected thereto.

If there is inconsistency in characteristic impedance at the connection points, transmission efficiency of the signal will be reduced. Particularly, the signal before input to the preamplifier IC (the signal before amplified) is so weak that it is easily influenced by the characteristic impedance at the connection points, so that the transmission efficiency of the signal is reduced easily.

For example, U.S. Pat. No. 5,712,749 proposes improvement of this suspension board with circuit, according to which an opening is formed in the stainless board at a location under the wires, to optimize the capacitance of the signal, so as to control the characteristic impedance.

This proposed construction can control the characteristic impedance of the suspension board with circuit itself, but it cannot control the characteristic impedances at the connection points between the lines of the suspension board with circuit and the terminal portions of the wired circuit board connected thereto. Accordingly, the problem of the reduction in transmission efficiency at the connection points remains unavoidable.

SUMMARY OF THE INVENTION

It is the object of the present invention to provide a wired circuit board that can control characteristic impedance at connection points between wires of a suspension board with circuit and terminal portions of the wired circuit board connected thereto with a simple structure, to improve signal transmission efficiency even for fine pitch wiring or for high frequency signal.

The present invention provides a novel wired circuit board to electrically connect with a suspension board with circuit having a metal substrate, an insulating base layer formed on the metal substrate, a conductor layer formed on the insulating base layer, and an insulating cover layer formed on the conductor layer, the wired circuit board comprising: a first wired circuit board electrically connected with the suspension board with circuit, and a second wired circuit board electrically connected with the first wired circuit board, for electrical connection with an external circuit, the first wired circuit board comprising a first metal substrate, a first insulating base layer formed on the first metal substrate, a first conductor layer formed on the first insulating base layer, and a first insulating cover layer formed on the first conductor layer.

In the wired circuit board of the present invention, it is preferable that the conductor layer of the suspension board with circuit and the first conductor layer of the first wired circuit board are formed by a semi-additive process.

In the wired circuit board of the present invention, it is preferable that the conductor layer of the suspension board with circuit and the first conductor layer of the first wired circuit board are substantially equal in thickness to each other.

Also, in the wired circuit board of the present invention, it is preferable that the insulating base layer of the suspension board with circuit and the first insulating base layer of the first wired circuit board are substantially equal in thickness to each other.

In addition, in the wired circuit board of the present invention, it is preferable that the insulating cover layer of the suspension board with circuit and the first insulating cover layer of the first wired circuit board are substantially equal in thickness to each other.

According to the wired circuit board of the present invention, since the first wired circuit board is substantially identical in layer structure with the suspension board with circuit, both characteristic impedances at a connection point between the suspension board with circuit and the first wired circuit board can be matched with each other, and as such can allow improvement in signal transmission efficiency in the wired circuit board having the first and second wired circuit boards even for fine pitch wiring of the suspension board with circuit or of the wired circuit board, or even for transmission of high-frequency signals.

BRIEF DESCRIPTION OF THE DRAWINGS

In the drawings.

(a) illustrates the process of preparing a metal substrate.

(b) illustrates the process of forming an insulating base layer in the form of a predetermined pattern on the metal substrate.

(c) illustrates the process of forming a thin conductor film, which serves as a ground layer, on the insulating base layer.

(d) illustrates the process of forming a plating resist on a portion of the thin conductor film corresponding to a reversed portion of a conductor layer forming portion of the same.

(e) illustrates the process of forming an electrolytic plated layer on the thin conductor film exposed from the plating resist by electrolytic plating.

(f) illustrates the process of removing the plating resist.

(g) illustrates the process of removing the thin conductor film on which the plating resist was formed.

(h) illustrates the process of forming on the insulating base layer including the conductor layer an insulating cover layer in the form of a predetermined pattern opened at portions thereof corresponding to a magnetic-head-side terminal portion and a first-wired-circuit-board-side terminal portion.

(i) illustrates the process of etching the metal substrate into a predetermined outer shape; and (j) illustrates the process of forming a connecting pad portion in the magnetic-head-side terminal portion and forming a connecting bump in the first-wired-circuit-board-side terminal portion.

(a) illustrates the process of preparing a first metal substrate.

(b) illustrates the process of forming on the first metal substrate a first insulating base layer in the form of a predetermined pattern opened at a portion thereof corresponding to a second-wired-circuit-board-side terminal portion.

(c) illustrates the process of forming a first thin conductor film, which serves as a ground layer, on the first insulating base layer.

(d) illustrates the process of forming a first plating resist on a portion of the first thin conductor film to be a reversed portion of a first conductor layer forming portion of the same.

(e) illustrates the process of forming a first electrolytic plated layer by electrolytic plating on the first thin conductor film exposed from the first plating resist.

(f) illustrates the process of removing the first plating resist.

(g) illustrates the process of removing the first thin conductor film on which the first plating resist was formed.

(h) illustrates the process of forming on the first insulating base layer including the first conductor layer a first insulating cover layer in the form of a predetermined pattern opened at portions thereof corresponding to a suspension-board-side terminal portion and an IC-side terminal portion.

(i) illustrates the process of etching a portion of the first metal substrate corresponding to a second-wired-circuit-board-side terminal portion; and (j) illustrates the process of mounting a preamplifier IC on the IC-side terminal portion.

(a) illustrates the process of preparing a second conductor layer.

(b) illustrates the process of forming a second insulating base layer on the second conductor layer.

(c) illustrates the process of forming an etching resist on a portion of the second conductor layer where a predetermined wired circuit pattern is to be formed.

(d) illustrates the process of etching the second conductor layer exposed from the etching resist.

(e) illustrates the process of removing the etching resist.

(f) illustrates the process of forming on the second insulating base layer including the second conductor layer a second insulating cover layer in the form of a predetermined pattern opened at portions thereof corresponding to a first-wired-circuit-board-side terminal portion and a control-circuit-board-side terminal portion; and (g) illustrates the process of adhesively bonding a stiffener board to the second insulating base layer at portions thereof corresponding to the first-wired-circuit-board-side terminal portion and the control-circuit-board-side terminal portion through an adhesive layer.

(a) illustrates the process of adhesively bonding an anisotropic conductive adhesive sheet to the second insulating cover layer of the second wired circuit board at a front end portion thereof including its surrounding area around the opening corresponding to the first-wired-circuit-board-side terminal portion; and (b) illustrates the process of press-bonding the first metal substrate of the first wired circuit board to the anisotropic conductive adhesive sheet.

(a) illustrates the process of preparing a first metal substrate.

(b) illustrates the process of forming a first insulating base layer on the first metal substrate.

(c) illustrates the process of forming a first thin conductor film, which serves as a ground layer, on the first insulating base layer.

(d) illustrates the process of forming a first plating resist on a portion of the first thin conductor film corresponding to a reversed portion of a first conductor layer forming portion of the same.

(e) illustrates the process of forming a first electrolytic plated layer by electrolytic plating on the first thin conductor film exposed from the first plating resist.

(f) illustrates the process of removing the first plating resist.

(g) illustrates the process of removing the first thin conductor film on which the first plating resist was formed.

(h) illustrates the process of forming, on the first insulating base layer including the first conductor layer, a first insulating cover layer in the form of a predetermined pattern opened at portions thereof corresponding to a suspension-board-side terminal portion and an IC-side terminal portion.

(i) illustrates the process of forming a through hole at a portion corresponding to the second wired circuit board side terminal portion; and (j) illustrates the process of mounting a preamplifier IC on the IC-side terminal portion.

(a) illustrates the process of adhesively bonding an adhesive sheet to the second insulating cover layer of the second wired circuit board at a front end portion thereof including its surrounding area around the opening corresponding to the first-wired-circuit-board-side terminal portion.

(b) illustrates the process of press-bonding the first metal substrate of the first wired circuit board to the adhesive sheet; and (c) illustrates the process of forming a solder connection portion in the through hole, whereby the first-wired-circuit-board-side terminal portion of the second wired circuit board and the second-wired-circuit-board-side terminal portion of the first wired circuit board are electrically connected with each other through the solder connection portion.

DETAILED DESCRIPTION OF THE PREFERRED EMBODIMENTS

Figure 1:
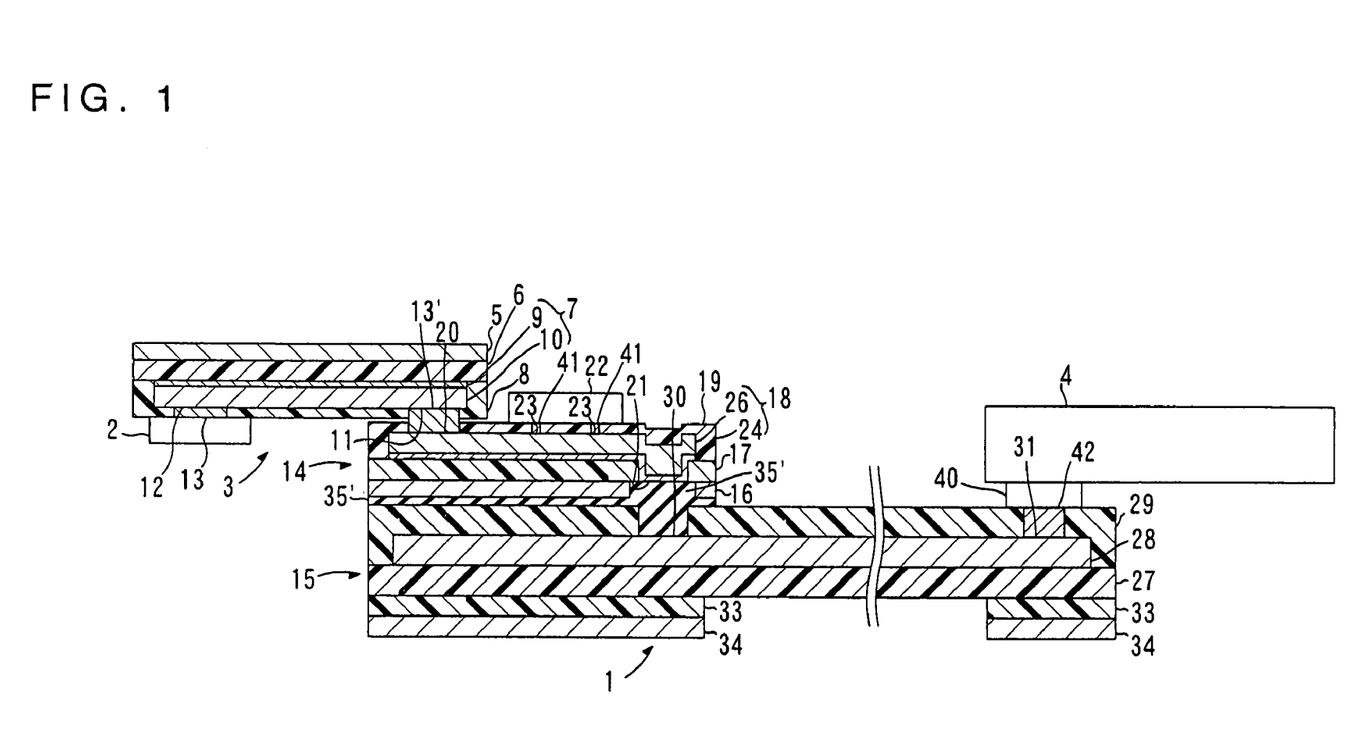
FIG. 1 is a sectional view showing a use condition of a relay flexible wiring circuit board as an embodiment of a wired circuit board of the present invention.

FIG. 1 is a sectional view showing a use condition of a relay flexible wiring circuit board taken as an embodiment of a wired circuit board of the present invention.

In FIG. 1, a relay flexible wiring circuit board 1 is a flexible wired circuit board used for connecting between a long-tail type suspension board with circuit 3 equipped with a magnetic head 2 of a hard disk drive and a control circuit board 4, which serves as an external circuit, for controlling the magnetic head 2.

The magnetic head 2 is arranged at a front end portion of the suspension board with circuit 3 and is supported above a rapidly spinning magnet disk (not shown) with a minute space therefrom so that a flying state of the magnetic head 2 can be well held against an airflow generated in the minute gap between the magnetic head 2 and the magnetic disk.

The suspension board with circuit 3 comprises a metal substrate 5, an insulating base layer 6 formed on the metal substrate 5, a conductor layer 7 formed on the insulating base layer 6, and an insulating cover layer 8 formed on the conductor layer 7. In this suspension board with circuit 3, the conductor layer 7 of a predetermined wired circuit pattern is formed on the flexible metal substrate 5 to be integral therewith. The suspension board with circuit 3 has a magnetic-head-side terminal portion 12 formed at a lengthwise front end portion thereof for connecting with the magnetic head 2 and a first-wired-circuit-board-side terminal portion 11 formed at a lengthwise rear end portion thereof for connecting with a first wired circuit board 14 of the relay flexible wiring circuit board 1.

Figure 2:
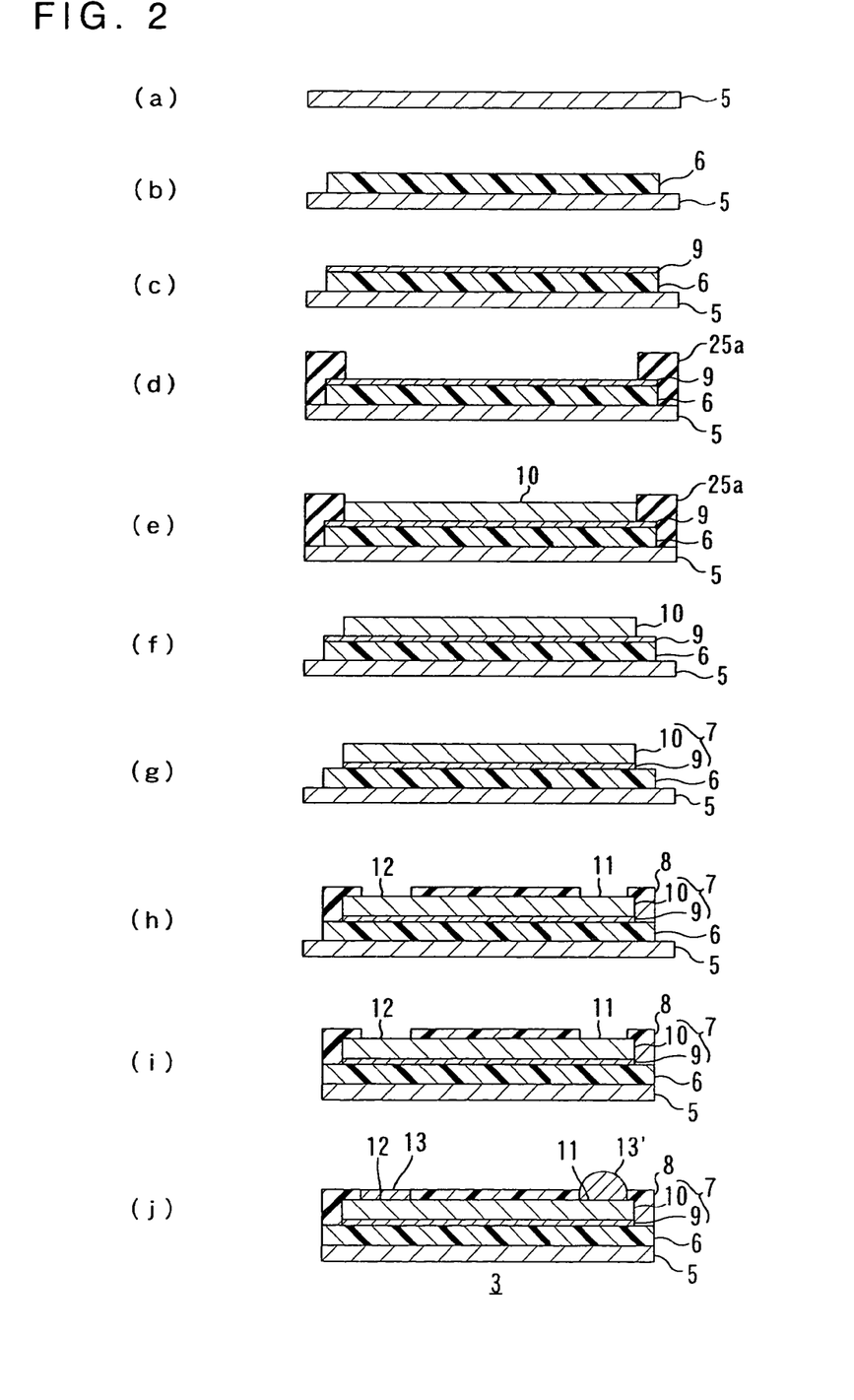
FIG. 2 is a process drawing of an embodiment illustrating production processes of a suspension board with circuit to be connected with the relay flexible wiring circuit board shown in FIG. 1.

This suspension board with circuit 3 can be produced, for example, by a method shown in FIG. 2.

First, the metal substrate 5 is prepared in this method, as shown in FIG. 2(a). The metal substrate 5 is formed of a metal foil or a thin metal sheet. For example, stainless steel, copper, aluminum, copper-beryllium, phosphor bronze, and 42 alloy may be used for the metal substrate 5. Stainless is preferably used for the metal substrate 5, in view of its characteristic of spring and corrosion resistance. It is preferable that the metal substrate 5 usually has a thickness in the range of 10–50 μm, or preferably 18–25 μm and a width in the range of 100–500 mm, or preferably 250–300 mm.

Then, the insulating base layer 6 in the form of a predetermined pattern is formed on the metal substrate 5 as shown in FIG. 2(b). The insulating base layer 6 is formed of synthetic resin, such as polyimide, polyether nitrile, polyether sulfone, polyethylene terephthalate, polyethylene naphthalate, or polyvinyl chloride for example. Preferably, photosensitive synthetic resin is used for the insulating base layer 6.

For forming the insulating base layer 6 of a predetermined pattern on the metal substrate 5, the following method can be adopted, for example. First, solution of photosensitive resin, such as solution of polyamic acid resin, is applied to a surface of the metal substrate 5. Then, the applied photosensitive resin is exposed to light and developed and thereafter it is cured by heating.

Then, a thin conductor film 9, which serves as a ground layer, is formed on the insulating base layer 6, as shown in FIG. 2(c). The vacuum film-forming method, sputtering in particular, is preferably used for forming the thin conductor film 9. The conductive materials that may be used for the thin conductor film 9 include chromium and copper. Specifically, it is preferable that a thin chromium film and a thin copper film are sequentially formed on the entire area of the insulating base layer 6 by sputtering. It is preferable that the thin chromium film has a thickness of 50–1,000 Å and the thin copper film has a thickness of 200–3,000 Å.

Then, a plating resist 25a is formed on a portion of the thin conductor film 9 to be a reversed portion of a conductor layer 7 forming portion of the same 9, as shown in FIG. 2(d). The plating resist 25a may be formed in a known method using dry film resist, for example.

Then, an electrolytic plated layer 10 is formed by electrolytic plating on the thin conductor film 9 exposed from the plating resist 25a, as shown in FIG. 2(e). The electrolytic plated layer 10 may be formed in a proper method, without any particular limitation. For example, the electrolytic plating of copper, nickel, gold, solder or alloys thereof may be used for forming the electrolytic plated layer 10. Preferably, the electrolytic copper plating is used. It is preferable that the electrolytic plated layer 10 usually has thickness in the range of 3–35 μm, or preferably 5–18 μm.

Thereafter, the plating resist 25a is removed by a known etching method, such as chemical etching (wet etching), or by peeling, as shown in FIG. 2(f). Then, the thin conductor film 9 on which the plating resist 25a was formed is also removed by a known etching method such as chemical etching (wet etching), as shown in FIG. 2(g). The conductor layer 7 comprising the thin conductor film 9 and the electrolytic plated layer 10 is formed by this semi-additive process.

The conductor layer 7 thus formed is in the form of a predetermined wired circuit pattern comprising e.g. write wires and read wires to the magnetic head 2.

The conductor layer 7 thus formed may be coated with an electroless plated layer of nickel by electroless nickel plating, if necessary.

Then, the insulating cover layer 8 of a predetermined pattern opened at portions thereof corresponding to the magnetic-head-side terminal portion 12 and the first-wired-circuit-board-side terminal portion 11 is formed on the insulating base layer 6 including the conductor layer 7, as shown in FIG. 2(h). For example, synthetic resin, such as polyimide, polyether nitrile, polyether sulfone, polyethylene terephthalate, polyethylene naphthalate, and polyvinyl chloride may be used for the insulating cover layer 8, as is the case with the insulating base layer 6. Preferably, photosensitive synthetic resin is used for the insulating cover layer 8.

For forming the insulating cover layer 8 of a predetermined pattern on the insulating base layer 6 including the conductor layer 7, the following method can be adopted, for example. First, solution of photosensitive resin, such as solution of polyamic acid resin, is applied to a surface of the insulating base layer 6 including the conductor layer 7. Then, the applied photosensitive resin is exposed to light and developed and thereafter it is cured by heating. The insulating cover layer 8 of a predetermined pattern opened at portions thereof corresponding to the magnetic-head-side terminal portion 12 and the first-wired-circuit-board-side terminal portion 11 is formed in this manner.

Thereafter, the metal substrate 5 is etched in a predetermined outer shape, as shown in FIG. 2(i). A known etching method, such as chemical etching (wet etching), is used for the etching of the metal substrate 5.

Then, a connecting pad 13 is formed in the magnetic-head-side terminal portion 12 by plating, for example, and also a connecting bump 13' is formed in the first-wired-circuit-board-side terminal portion 11 by solder printing, for example, as shown in FIG. 2(j). The suspension board with circuit 3 is produced in the manner mentioned above.

The relay flexible wiring circuit board 1 comprises the first wired circuit board 14 which is electrically connected with the suspension board with circuit 3 and a second wired circuit board 15 which is electrically connected with the first wired circuit board 14 and is to be electrically connected with the control circuit board 4, as shown in FIG. 1.

The first wired circuit board 14 comprises a first metal substrate 16, a first insulating base layer 17 formed on the first metal substrate 16, a first conductor layer 18 formed on the first insulating base layer 17, and a first insulating cover layer 19 formed on the first conductor layer 18. The first wired circuit board 14 has a suspension-board-side terminal portion 20, formed at a lengthwise front end portion thereof, for connecting with the suspension board with circuit 3, a second-wired-circuit-board-side terminal portion 21, formed at a lengthwise rear end portion thereof, for connecting with the second wired circuit board 15, and an IC-side terminal portion 23, formed at a lengthwise intermediate portion thereof, for equipment with a preamplifier IC 22.

Figure 3:
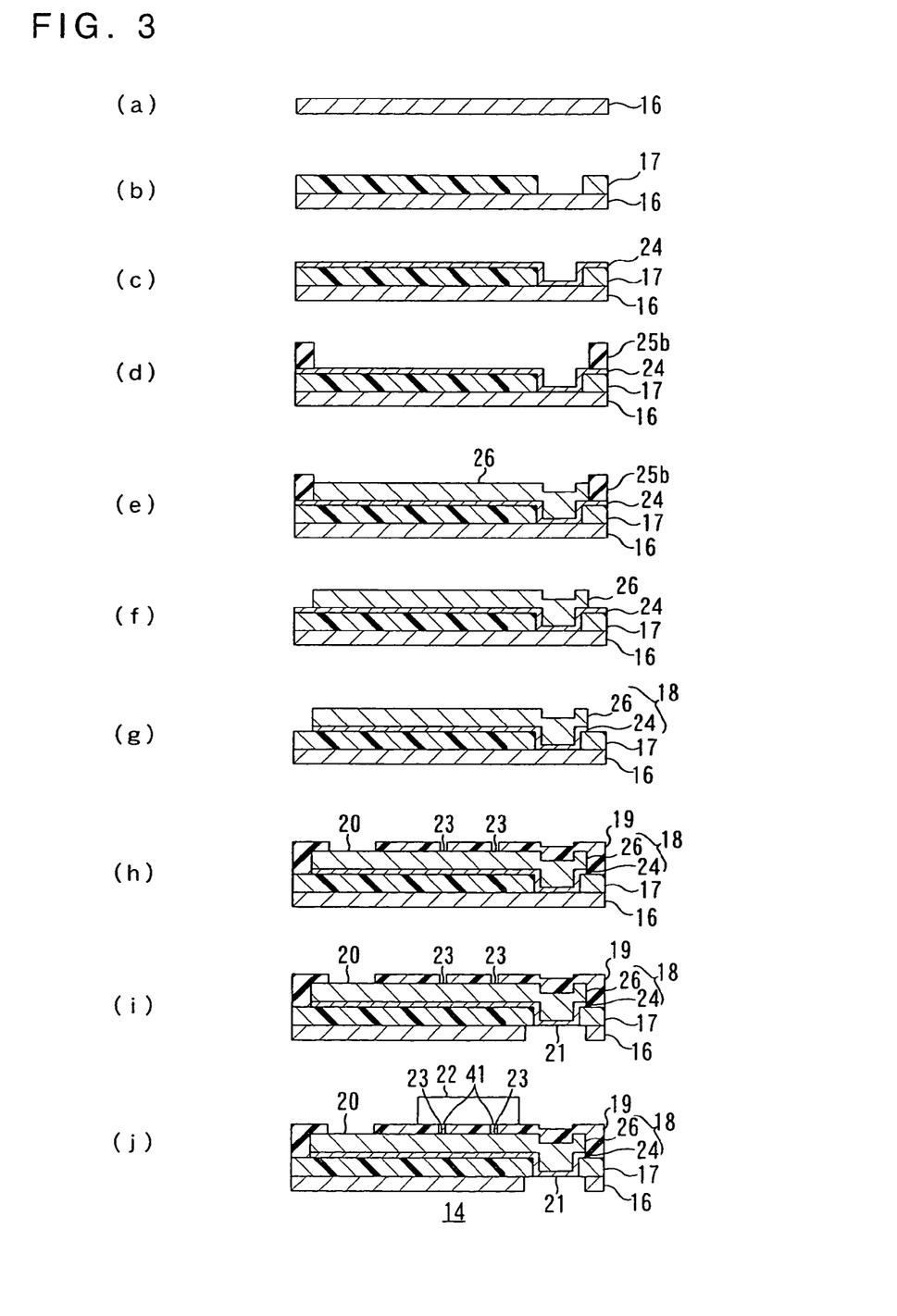
FIG. 3 is a process drawing of an embodiment illustrating production processes of a first wired circuit board of the relay flexible wiring circuit board shown in FIG. 1.

This first wired circuit board 14 can be produced, for example, by a method shown in FIG. 3.

First, the first metal substrate 16 is prepared in this method, as shown in FIG. 3(*a*). The first metal substrate 16 is formed of a metal foil or a thin metal sheet. For example, stainless steel, copper, aluminum, copper-beryllium, phosphor bronze, and 42 alloy may be used for the first metal substrate 16. Stainless is preferably used for the first metal substrate 16, in view of its characteristic of spring and corrosion resistance. It is preferable that the first metal substrate 16 usually has a thickness in the range of 10–50 µm, or preferably 18–25 µm and a width in the range of 100–500 mm, or preferably 250–300 mm.

It is preferable that the first metal substrate 16 is formed of the same metal as that of the metal substrate 5 of the suspension board with circuit 3 and also has substantially the same thickness and width as those of the metal substrate 5. The use of the first metal substrate 16 formed of the same metal as that of the metal substrate 5 of the suspension board with circuit 3 and also having substantially the same thickness and width as those of the metal substrate 5 can provide reliable matching of characteristic impedances at the connection point, as mentioned later.

Then, the first insulating base layer 17 in the form of a predetermined pattern opened at a portion thereof corresponding to the second-wired-circuit-board-side terminal portion 21 is formed on the first metal substrate 16, as shown in FIG. 3(*b*). The first insulating base layer 17 may be formed of synthetic resin, such as polyimide, polyether nitrile, polyether sulfonic, polyethylene terephthalate, polyethylene naphthalate, and polyvinyl chloride for example. Preferably, photosensitive synthetic resin is used for the first insulating base layer 17.

For forming the first insulating base layer 17 of a predetermined pattern on the first metal substrate 16, the following method can be adopted, for example. First, solution of photosensitive resin, such as solution of polyamic acid resin, is applied to a surface of the first metal substrate 16. Then, the applied photosensitive resin is exposed to light and developed and thereafter it is cured by heating. The first insulating base layer 17 in the form of a predetermined pattern opened at a portion thereof corresponding to the second-wired-circuit-board-side terminal portion 21 is formed in this manner.

It is preferable that the first insulating base layer 17 is formed of the same material (synthetic resin) as that of the insulating base layer 6 of the suspension board with circuit 3 and also has substantially the same thickness as that of the insulating base layer 6. The use of the first insulating base layer 17 formed of the same material (synthetic resin) as that of the insulating base layer 6 of the suspension board with circuit 3 and also having substantially the same thickness as that of the insulating base layer 6 can provide reliable matching of characteristic impedances at the connection point, as mentioned later.

Then, a first thin conductor film 24, which serves as a ground layer, is formed on the first insulating base layer 17, as shown in FIG. 3(*c*). The vacuum film-forming method, sputtering in particular, is preferably used for forming the first thin conductor film 24. The conductive materials that may be used for the first thin conductor film 24 include chromium and copper. Specifically, it is preferable that a thin chromium film and a thin copper film are sequentially formed on the entire area of the first insulating base layer 17 by sputtering, as in the case of the suspension board with circuit 3. It is preferable that the thin chromium film has a thickness of 50–1,000 Å and the thin copper film has a thickness of 200–3,000 Å.

Then, a first plating resist 25*b* is formed on a portion of the first thin conductor film 24 to be a reversed portion to a first conductor layer 18 forming portion of the same 24, as shown in FIG. 3(*d*). The first plating resist 25*b* may be formed in a known method using dry film resist, for example.

Then, a first electrolytic plated layer 26 is formed by electrolytic plating on the first thin conductor film 24 exposed from the first plating resist 25*b*, as shown in FIG. 3(*e*). The first electrolytic plated layer 26 may be formed in a proper method, without any particular limitation. For example, the electrolytic plating of copper, nickel, gold, solder or alloys thereof may be used for forming the first electrolytic plated layer 26. Preferably, the electrolytic copper plating is used. It is preferable that the first electrolytic plated layer 26 usually has thickness in the range of 3–35 µm, or preferably 5–18 µm.

Thereafter, the first plating resist 25*b* is removed by a known etching method, such as chemical etching (wet etching), or by peeling, as shown in FIG. 3(*f*). Then, the first thin conductor film 24 on which the first plating resist 25*b* was formed is also removed by a known etching method such as chemical etching (wet etching) or by peeling, as shown in FIG. 3(*g*). The first conductor layer 18 comprising the first thin conductor film 24 and the first electrolytic plated layer 26 is formed by this semi-additive process.

The first conductor layer 18 thus formed is in the form of a predetermined wired circuit pattern comprising e.g. write wires and read wires corresponding to those of the conductor layer 7 of the suspension board with circuit 3.

The first conductor layer 18 thus formed may be coated with an electroless plated layer of nickel by electroless nickel plating, if necessary.

It is preferable that the first conductor layer 18 is formed of the same metal as that of the conductor layer 7 of the suspension board with circuit 3 and also has substantially the same thickness and wiring as those of the conductor layer 7 of the suspension board with circuit 3. The use of the first conductor layer 18 formed of the same metal as that of the conductor layer 7 of the suspension board with circuit 3 and also having substantially the same thickness and wiring as those of the conductor layer 7 of the suspension board with circuit 3 can provide reliable matching of characteristic impedances at the connection point, as mentioned later.

Then, the first insulating cover layer 19 of a predetermined pattern opened at portions thereof corresponding to the suspension-board-side terminal portion 20 and the IC-side terminal portion 23 is formed on the first insulating base layer 17 including the first conductor layer 18, as shown in FIG. 3(*h*). For example, synthetic resin, such as polyimide, polyether nitrile, polyether sulfone, polyethylene terephthalate, polyethylene naphthalate, and polyvinyl chloride may be used for the first insulating cover layer 19, as is the case with the first insulating base layer 17. Preferably, photosensitive synthetic resin is used for the first insulating cover layer 19.

For forming the first insulating cover layer 19 of a predetermined pattern on the first insulating base layer 17 including the first conductor layer 18, the following method can be adopted, for example. First, solution of photosensitive resin, such as solution of polyamic acid resin, is applied to a surface of the first insulating base layer 17 including the first conductor layer 18. Then, the applied photosensitive resin is exposed to light and developed and thereafter it is cured by heating. The first insulating cover layer 19 of a predetermined pattern opened at portions thereof corresponding to the suspension-board-side terminal portion 20 and the IC-side terminal portion 23 is formed in this manner. A portion of the first conductor layer 18 exposed from the opening corresponding to the suspension-board-side terminal portion 20 of the first insulating cover layer 19 serves as the suspension-board-side terminal portion 20, and a portion of the first conductor layer 18 exposed from the opening corresponding to the IC-side terminal portion 23 of the first insulating cover layer 19 serves as the IC-side terminal portion 23.

Thereafter, a portion of the first metal substrate 16 corresponding to the second-wired-circuit-board-side terminal portion 21 is etched, as shown in FIG. 3(*i*). A known etching method, such as chemical etching (wet etching), is used for the etching of the first metal substrate 16. A portion of the first conductor layer 18 exposed from the opening of the first metal substrate 16 serves as the second-wired-circuit-board-side terminal portion 21. The opening of the first metal substrate 16 is formed to be larger than a solder bump 36 mentioned later.

Then, a connecting pad 41 is formed in the IC-side terminal portion 23 by plating, for example, so that the preamplifier IC 22 is mounted on the IC-side terminal portion 23 through the connecting pad 41, as shown in FIG. 3(*j*). The first wired circuit board 14 equipped with the preamplifier IC 22 is produced in the manner mentioned above.

The second wired circuit board 15 comprises a second insulating base layer 27, a second conductor layer 28 formed on the second insulating base layer 27, and a second insulating cover layer 29 formed on the second conductor layer 28, as shown in FIG. 1. The second wired circuit board 15 has a first-wired-circuit-board-side terminal portion 30, formed at a lengthwise front end portion thereof, for connecting with the second-wired-circuit-board-side terminal portion 21 of the first wired circuit board 14 and also has a control-circuit-board-side terminal portion 31, formed at a lengthwise rear end portion thereof, for connecting with the control circuit board 4. In order to acquire the bonding strength, the second wired circuit board 15 is provided with a stiffener board 34 bonded to the second insulating base layer 27 through an adhesive layer 33 to correspond in position to the first-wired-circuit-board-side terminal portion 30 and control-circuit-board-side terminal portion 31.

Figure 4:
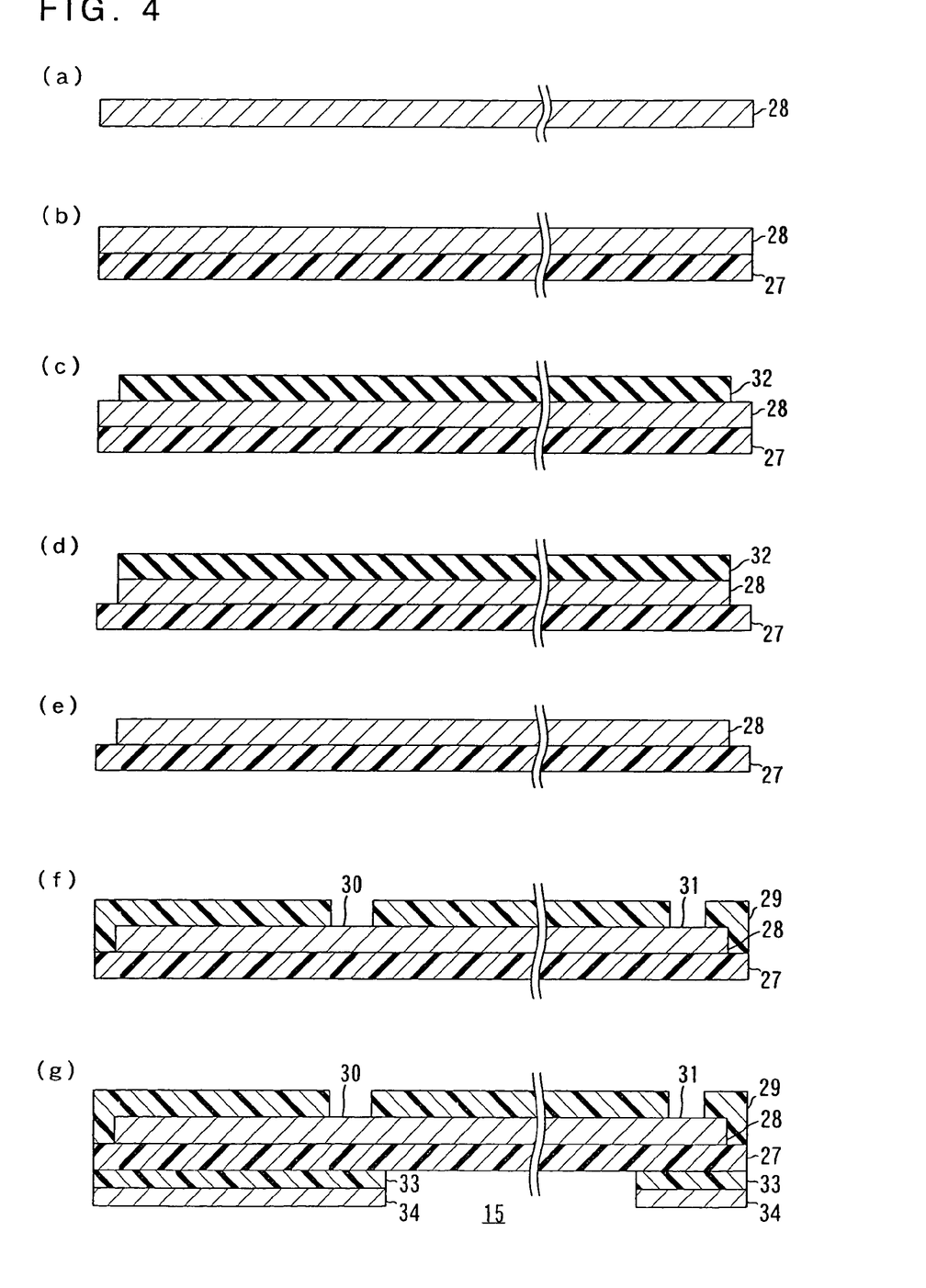
FIG. 4 is a process drawing of an embodiment illustrating production processes of a second wired circuit board of the relay flexible wiring circuit board shown in FIG. 1.

This second wired circuit board 15 can be produced, for example, by a method shown in FIG. 4.

First, the second conductor layer 28 of a metal foil or a thin metal sheet is prepared in this method, as shown in FIG. 4(*a*). For example, a metal foil or a thin metal sheet of copper, nickel, gold, solder, or alloys thereof may be used for the second conductor layer 28. Preferably, a copper foil is used for the second conductor layer 28. It is preferable that the second conductor layer 28 usually has a thickness in the range of 5–50 µm, or preferably 9–35 µm.

Then, the second insulating base layer 27 of a predetermined pattern is formed on the second conductor layer 28, as shown in FIG. 4(*b*). The second insulating base layer 27 is formed of synthetic resin, such as polyimide, polyether nitrile, polyether sulfone, polyethylene terephthalate, polyethylene naphthalate, and polyvinyl chloride may be used for the second insulating base layer 27.

For forming the second insulating base layer 27 of a predetermined pattern on the second conductor layer 28, the following method may be adopted, for example. The second insulating base layer 27 in the form of a film previously formed in a predetermined pattern is adhesively bonded to a surface of the second conductor layer 28 through the adhesive layer not shown. Alternatively, after solution of photosensitive resin, such as solution of polyamic acid resin, is applied to a surface of the second conductor layer 28, the applied photosensitive resin is exposed to light, developed, and cured by heating, whereby the second insulating base layer 27 is formed directly on the second conductor layer 28. The second insulating base layer 27 of a predetermined pattern can be formed in this manner.

Then, an etching resist 32 is formed on a portion of the second conductor layer 28 to be formed into a predetermined wired circuit pattern, as shown in FIG. 4(*c*). The etching resist 32 may be formed in a known method using dry film resist, for example.

Then, after the second conductor layer 28 exposed from the etching resist 32 is etched by a known etching method, such as chemical etching (wet etching), as shown in FIG. 4(*d*), the etching resist 32 is removed by a known etching method, such as chemical etching (wet etching), or by peeling, as shown in FIG. 4(*e*). The second conductor layer 28 is formed in a predetermined wired circuit pattern by the semi-additive process.

Then, the second insulating cover layer 29 of a predetermined pattern opened at its portions corresponding to the first-wired-circuit-board-side terminal portion 30 and the control-circuit-board-side terminal portion 31 is formed on the second insulating base layer 27 including the second conductor layer 28, as shown in FIG. 4(*f*). For example, synthetic resin, such as polyimide, polyether nitrile, polyether sulfone, polyethylene terephthalate, polyethylene naphthalate, and polyvinyl chloride may be used for the second insulating cover layer 29, as is the case with the second insulating base layer 27.

For forming the second insulating cover layer 29 of a predetermined pattern on the second insulating base layer 27 including the second conductor layer 28, the following method can be adopted, for example. The second insulating cover layer 29 in the form of a film previously formed in a predetermined pattern is adhesively bonded to a surface of the second conductor layer 28 through the adhesive layer not shown. Alternatively, after solution of photosensitive resin, such as solution of polyamic acid resin, is applied to a surface of the second conductor layer 28, the applied photosensitive resin is exposed to light, developed, and cured by heating, whereby the second insulating cover layer 29 is formed directly on the second insulating base layer 27. The second insulating cover layer 29 of a predetermined pattern opened at portions thereof corresponding to the first-wired-circuit-board-side terminal portion 30 and control-circuitboard-side terminal portion 31 is formed in this manner. A portion of the second conductor layer 28 exposed from the opening corresponding to the first-wired-circuit-board-side terminal portion 30 of the second insulating cover layer 29 serves as the first-wired-circuit-board-side terminal portion 30, and a portion of the second conductor layer 28 exposed from the opening corresponding to the control-circuit-board-side terminal portion 31 of the second insulating cover layer 29 serves as the control-circuit-board-side terminal portion 31.

Thereafter, the stiffener board 34 is adhesively bonded to the second insulating base layer 27 through the adhesive layer 33 to correspond in position to the first-wired-circuit-board-side terminal portion 30 and control-circuit-board-side terminal portion 31, to thereby produce the second wired circuit board 15, as shown in FIG. 4(g). The adhesive layer 33 is formed of epoxy adhesive for example and has a thickness in the range of 5–30 µm, for example. The stiffener board 34 is formed of a metal foil, such as an aluminum foil, a copper foil, or a stainless foil, and has a thickness in the range of 30–500 µm, for example.

The relay flexible wiring circuit board 1 is formed by connecting the first-wired-circuit-board-side terminal portion 30 of the second wired circuit board 15 and the second-wired-circuit-board-side terminal portion 21 of the first wired circuit board 14 electrically, as shown in FIG. 1.

Figure 5:
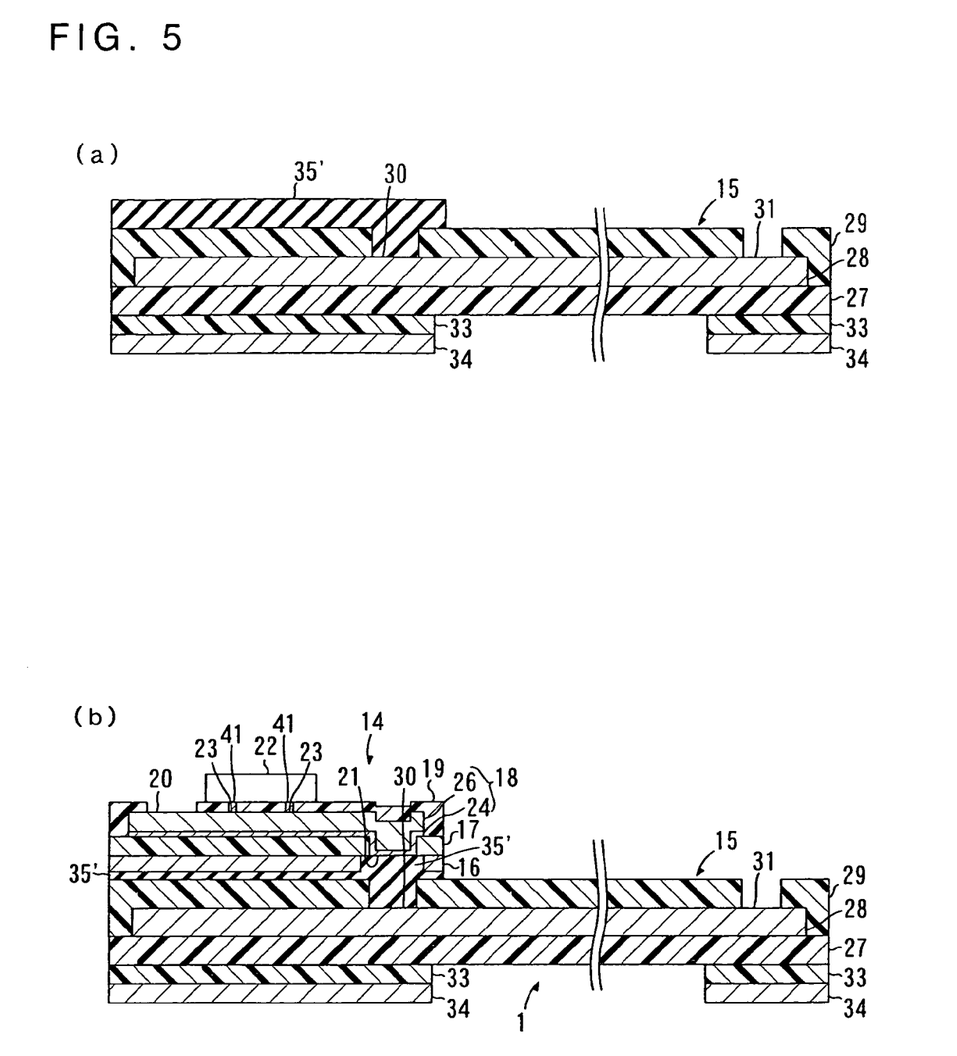
FIG. 5 is a process drawing of an embodiment of a method for producing a relay flexible wiring circuit board by joining together the first wired circuit board shown in FIG. 3 and the second wired circuit board shown in FIG. 4.

For electrically connecting the first-wired-circuit-board-side terminal portion 30 of the second wired circuit board 15 and the second-wired-circuit-board-side terminal portion 21 of the first wired circuit board 14, the method shown in FIG. 5 can be adopted, for example.

First, an anisotropic conductive adhesive sheet 35' is adhesively bonded to the second insulating cover layer 29 of the second wired circuit board 15 at a front end portion thereof including its surrounding area around the opening corresponding to the first-wired-circuit-board-side terminal portion 30, as shown in FIG. 5(a). The anisotropic conductive adhesive sheet 35' is formed of e.g. a thermosetting adhesive in which metallic particles are dispersed and has a thickness in the range of 10–50 µm, for example.

Then, the first metal substrate 16 of the first wired circuit board 14 is press-bonded to the anisotropic conductive adhesive sheet 35' in the condition that the second-wired-circuit-board-side terminal portion 21 is in alignment and to correspond with the first-wired-circuit-board-side terminal portion 30, thus connecting the first wired circuit board 14 and the second wired circuit board 15 together, as shown in FIG. 5(b). After this manner, the relay flexible wiring circuit board 1 is produced wherein the first-wired-circuit-board-side terminal portion 30 of the second wired circuit board 15 and the second-wired-circuit-board-side terminal portion 21 of the first wired circuit board 14 are electrically connected with each other through the anisotropic conductive adhesive sheet 35'.

In use, the relay flexible wiring circuit board 1 thus formed is for example in the condition in which the first-wired-circuit-board-side terminal portion 11 of the suspension board with circuit 3 and the suspension-board-side terminal portion 20 of the first wired circuit board 14 are electrically connected with each other through the connecting bump 13', as shown in FIG. 1. The control-circuit-board-side terminal portion 31 of the second wired circuit board 15 has a connecting pad 42 formed by plating for example. The control-circuit-board-side terminal portion 31 of the second wired circuit board 15 is connected with a connector 40 through the connecting pad 42, and the second wired circuit board 15 is electrically connected with the control circuit board 4 through the connector 40. The magnetic head 2 is mounted on the magnetic-head-side terminal portion 12 of the suspension board with circuit 3 through the connecting pad 13.

In this relay flexible wiring circuit board 1, read signals and write signals to the magnetic head 2 are amplified by the preamplifier IC 22 on the first wired circuit board 14 interposed between the suspension board with circuit 3 and the control circuit board 4 when transmitted from the second wired circuit board 15 to the control circuit board 4.

In this relay flexible wiring circuit board 1, the layer structure of the suspension board with circuit 3 is formed by the metal substrate 5, the insulating base layer 6, the conductor layer 7 and the insulating cover layer 8, while also the layer structure of the first wired circuit board 14 is formed by the first metal substrate 16, the first insulating base layer 17, the first conductor layer 18 and the first insulating cover layer 19. In other words, the suspension board with circuit 3 and the first wired circuit board 14 are substantially identical in layer structure with each other. This structure enables both characteristic impedances at the connection point between the first-wired-circuit-board-side terminal portion 11 of the suspension board with circuit 3 and the suspension-board-side terminal portion 20 of the first wired circuit board 14 to be matched with each other. This can allow improvement in signal transmission efficiency in the relay flexible wiring circuit board 1 having the first and second wired circuit boards 14 and 15 even the suspension board with circuit 3 and relay flexible wiring circuit board 1 are formed with fine pitch or high-frequency signals are transmitted.

In this relay flexible wiring circuit board 1, the first conductor layer 18 of the first wired circuit board 14 is formed to have the same wired circuit pattern and thickness as the conductor layer 7 of the suspension board with circuit 3 by the semi-additive process. This can contribute to a reliable matching of the characteristic impedances.

Also, in this relay flexible wiring circuit board 1, the second conductor layer 28 of the second wired circuit board 15 is formed in a predetermined wired circuit pattern by the subtractive process. This can prevent occurrence of cracking or breaking of wire in between the first-wired-circuit-board-side terminal portion 30 and the control-circuit-board-side terminal portion 31 of the second wired circuit board 15 (or between the stiffener boards 34 arranged at both lengthwise end portions of the relay flexible wiring circuit board 1), ensuring good flexibility.

In addition, in this relay flexible wiring circuit board 1, the metal substrate 5 of the suspension board with circuit 3 and the first metal substrate 16 of the first wired circuit board 14 are substantially equal in thickness to each other; the insulating base layer 6 of the suspension board with circuit 3 and the first insulating base layer 17 of the first wired circuit board 14 are substantially equal in thickness to each other; and the insulating cover layer 8 of the suspension board with circuit 3 and the first insulating cover layer 19 of the first wired circuit board 14 are substantially equal in thickness to each other. This can also contribute to the reliable matching of the characteristic impedances.

Figure 6:
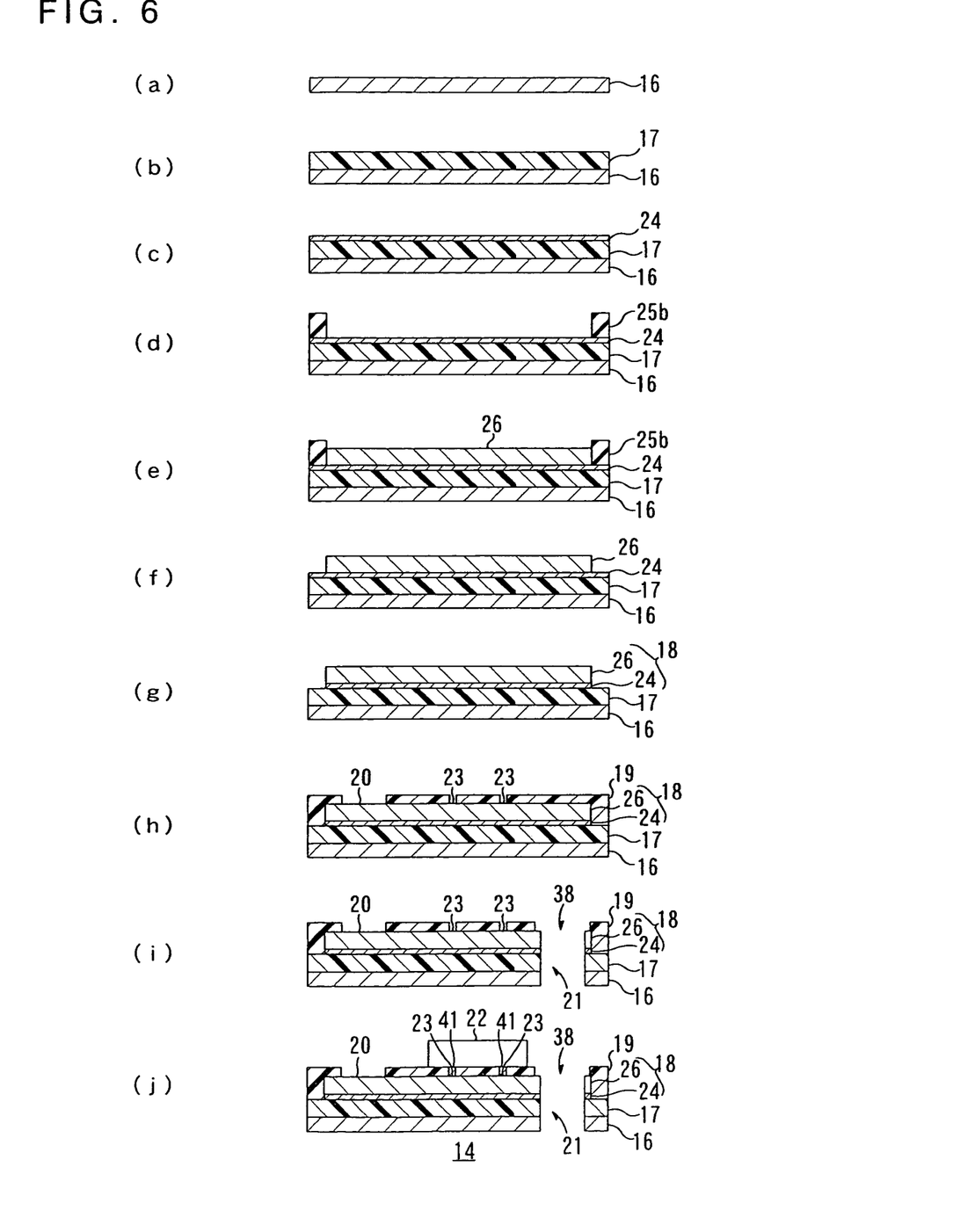
FIG. 6 is a process drawing of another embodiment (having a feature of forming a through hole) illustrating a method for producing the first wired circuit board of the relay flexible wiring circuit board shown in FIG. 1.

In this relay flexible wiring circuit board 1, the first wired circuit board 14 may be formed in an alternative method shown in FIG. 6 for example.

First, the first metal substrate 16 is prepared in this method, as is the case described above, as shown in FIG. 6(a). Then, the first insulating base layer 17 in the form of a predetermined pattern is formed on the first metal substrate 16, as is the case described above, as shown in FIG. 6(b). In the method illustrated in FIG. 6, the opening need not be formed in the first insulating base layer 17 at a portion thereof corresponding to the second wired-circuit-board-side terminal portion 21.

Then, after forming the first thin conductor film 24, which serves as the ground layer, is formed on the first insulating base layer 17 in the same manner as in the case described above, as shown in FIG. 6(c), the first plating resist 25b is formed on a portion of the first thin conductor film 24 corresponding to a reversed portion of the first conductor layer 18 forming portion of the same 24, in the same manner as in the case described above, as shown in FIG. 6(d). Thereafter, the first electrolytic plated layer 26 is formed by electrolytic plating on the first thin conductor film 24 exposed from the first plating resist 25b, in the same manner as in the case described above, as shown in FIG. 6(e). Then, the first plating resist 25b is removed by a known etching method, such as chemical etching (wet etching), or by peeling, as is the case described above, as shown in FIG. 6(f). Thereafter, the first thin conductor film 24 on which the first plating resist 25b was formed is also removed by a known etching method such as chemical etching (wet etching), as shown in FIG. 6(g). The first conductor layer 18 comprising the first thin conductor film 24 and the first electrolytic plated layer 26 is formed by this semi-additive process.

Then, the first insulating cover layer 19 of a predetermined pattern opened at portions thereof corresponding to the suspension-board-side terminal portion 20 and the IC-side terminal portion 23 is formed on the first insulating base layer 17 including the first conductor layer 18 in the same manner described above, as shown in FIG. 6(h). Thereafter, a through hole 38 extending through the first insulating cover layer 19, the first conductor layer 18, the first insulating base layer 17 and the first metal substrate 16 is formed at a location corresponding to the second-wired-circuit-board-side terminal portion 21, as shown in FIG. 6(i). It has a diameter of e.g. 0.2–0.5 mm φ. The through hole 38 can be formed by a known method, such as drilling, punching, or etching.

Preferably, the through hole 38 is formed in the following manner. The insulating cover layer 19 is previously formed to have a pattern having an opening of a larger diameter than the through hole 38, first, and, then, the through hole 38 is formed to extend through the first conductor layer 18, the first insulating base layer 17 and the first metal substrate 16 by the method mentioned above, as shown in FIG. 6(i).

Thereafter, a connecting pad 41 is formed in the IC-side terminal portion 23 by plating for example and then the preamplifier IC 22 is mounted on the IC-side terminal portion 23 through the connecting pad 41, as shown in FIG. 6(j). The first wired circuit board 14 equipped with the preamplifier IC 22 is produced in this manner.

Figure 7:
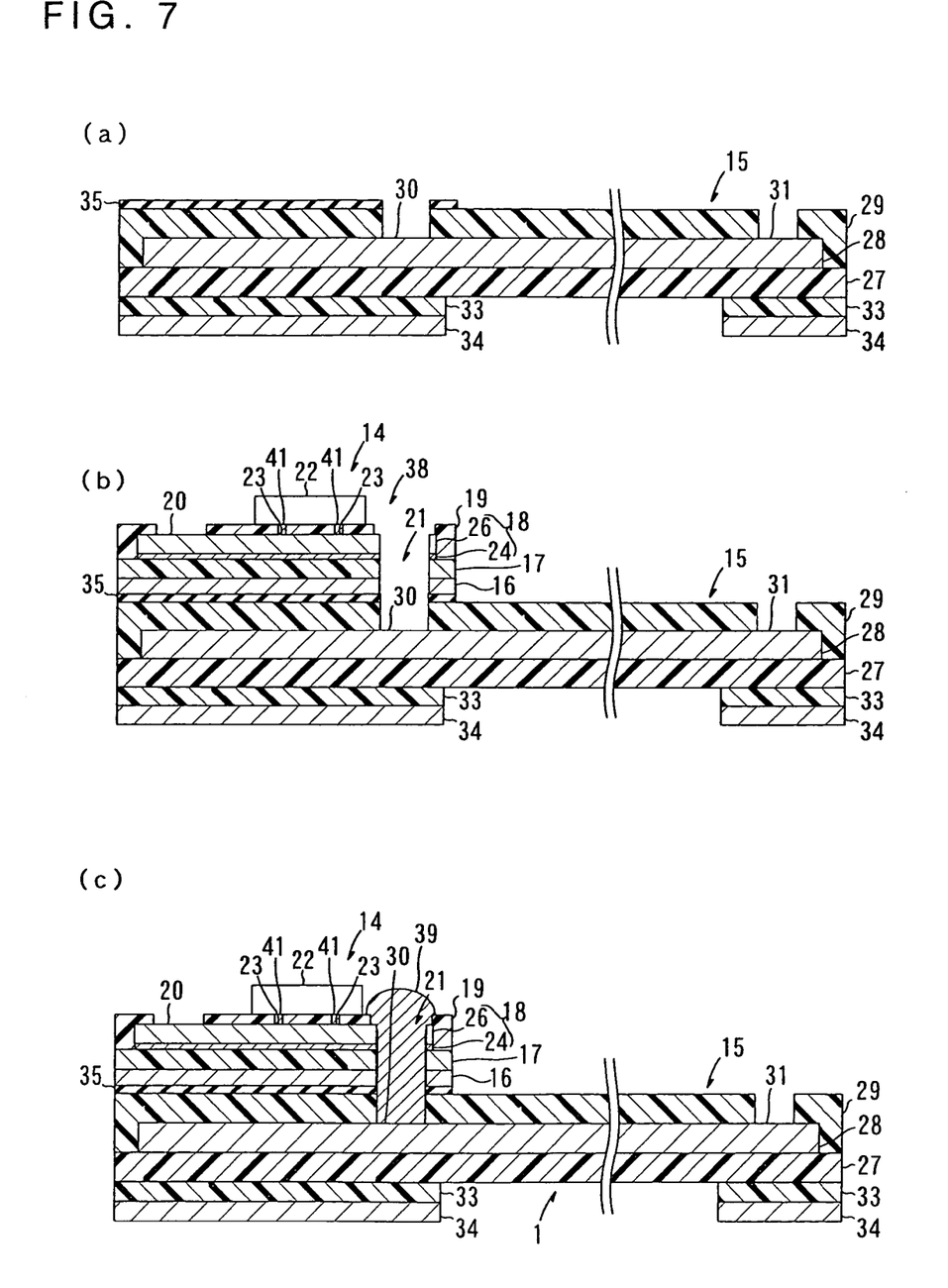
FIG. 7 is a process drawing of an embodiment of a method for producing a relay flexible wiring circuit board by joining together the first wired circuit board shown in FIG. 6 and the second wired circuit board shown in FIG. 4.

Then, the relay flexible wiring circuit board 1 is produced by connecting the first wired circuit board 14 thus formed with the second wired circuit board 15 by the method shown in FIG. 7 for example.

First, an adhesive sheet 35 having an opening corresponding to the opening of the second insulating cover layer 29 is adhesively bonded to the second insulating cover layer 29 of the second wired circuit board 15 at a front end portion thereof including its surrounding area around the opening corresponding to the first-wired-circuit-board-side terminal portion 30, as shown in FIG. 7(a).

Then, the first metal substrate 16 of the first wired circuit board 14 is press-bonded to the adhesive sheet 35 in the condition that the through hole 38 of the second-wired-circuit-board-side terminal portion 21 is in alignment and to correspond with the first-wired-circuit-board-side terminal portion 30, thus connecting the first wired circuit board 14 and the second wired circuit board 15 together as shown in FIG. 7 (b).

Thereafter, solder cream is filled in the through hole 38 and soldered by reflow soldering to form a solder connecting portion 39, as shown in FIG. 7(c). After this manner, the relay flexible wiring circuit board 1 is produced wherein the first-wired-circuit-board-side terminal portion 30 of the second wired circuit board 15 and the second-wired-circuit-board-side terminal portion 21 of the first wired circuit board 14 are electrically connected with each other through the solder connecting portion 39.

In this relay flexible wiring circuit board 1 as well, since the suspension board with circuit 3 and the first wired circuit board 14 are substantially identical in layer structure with each other, both characteristic impedances at the connection point between the first-wired-circuit-board-side terminal portion 11 of the suspension board with circuit 3 and the suspension-board-side terminal portion 20 of the first wired circuit board 14 can be matched with each other. This can allow improvement in signal transmission efficiency in the relay flexible wiring circuit board 1 having the first and second wired circuit boards 14 and 15 even for fine pitch of the suspension board with circuit 3 and relay flexible wiring circuit board 1 are formed with fine pitch or high-frequency signals are transmitted.

EXAMPLES

While in the following, the present invention will be described in further detail with reference to Examples and Comparative Example, the present invention is not limited to any Examples and Comparative Example.

Example 1

1) Production of First Wired Circuit Board

A first metal substrate of stainless foil having thickness of 25 μm was prepared (Cf. FIG. 3(a)). Then, after solution of polyamic acid resin was applied to a surface of the first metal substrate, the applied resin was exposed to light and developed and thereafter cured by heating, thereby producing the first insulating base layer of polyimide having thickness of 10 μm of a predetermined pattern opened at a portion thereof corresponding to the second-wired-circuit-board-side terminal portion (Cf. FIG. 3(b)).

Then, a thin chromium film having thickness of 300 Å and a thin copper film having thickness of 800 Å were sequentially formed on the entire area of the first insulating base layer by sputtering, thereby forming a first thin conductor film which serves as a ground layer (Cf. FIG. 3(c)). Thereafter, a first plating resist was formed on a portion of the first thin conductor film corresponding to a reversed portion of a first conductor layer forming portion of the same (Cf. FIG. 3(d)). Then, a first electrolytic plated layer of copper having thickness of 10 μm was formed by electrolytic copper plating on the first thin conductor film exposed from the first plating resist (CF. FIG. 3(e)). Thereafter, the first plating resist was removed by the chemical etching (Cf. FIG. 3(f)). Then, the first thin conductor film on which the first plating resist had been formed was also removed by the chemical etching (Cf. FIG. 3(g)). The first conductor layer comprising the first thin conductor film and the first electrolytic plated layer was formed by this semi-additive process.

Then, after solution of polyamic acid resin was applied to a surface of the first insulating base 1 layer including the first conductor layer, the applied resin was exposed to light and developed and thereafter cured by heating, thereby producing the first insulating cover layer of polyimide having thickness of 3 μm of a predetermined pattern opened at portions thereof corresponding to the suspension-board-side terminal portion and the IC-side terminal portion (Cf. FIG. 3(h)).

Thereafter, a portion of the first metal substrate corresponding to the second-wired-circuit-board-side terminal portion was chemically etched (Cf. FIG. 3(i)). Then, a preamplifier IC was mounted on the IC-side terminal portion through the connecting pad, thereby producing the first wired circuit board equipped with the preamplifier IC (Cf. FIG. 3(j)).

2) Production of Second Wired Circuit Board

A second conductor layer of rolled copper foil having thickness of 18 μm was prepared (Cf. FIG. 4(a)). Then, a second insulating base layer of polyimide film having thickness of 25 μm was adhesively bonded to the second conductor layer through an epoxy adhesive layer having thickness of 15 μm (Cf. FIG. 4(b)). Thereafter, an etching resist of a dry film resist was formed on a portion of the second conductor layer to be formed into a predetermined wired circuit pattern (Cf. FIG. 4(c)). Then, after the second conductor layer exposed from the etching resist was etched by the chemical etching (Cf. FIG. 4(d)), the etching resist was removed by the chemical etching. The second conductor layer was formed in a predetermined wired circuit pattern by the semi-additive process (Cf. FIG. 4(e)).

Then, the second insulating cover layer of a polyimide film having thickness of 25 μm of a predetermined pattern opened at its portions corresponding to the first-wired-circuit-board-side terminal portion and the control-circuit-board-side terminal portion was adhesively bonded to the second conductor layer through an epoxy adhesive layer having thickness of 15 μm (Cf. FIG. 4(f)).

Thereafter, stiffener boards of aluminum having thickness of 100 μm were adhesively bonded to the second insulating base layer through the epoxy adhesive layer having thickness of 25 μm to correspond in position to the first-wired-circuit-board-side terminal portion and control-circuit-board-side terminal portion, respectively, thereby producing the second wired circuit board (Cf. FIG. 4(g)).

3) Production of Flexible Wired Junction Circuit Board

An anisotropic conductive adhesive sheet having thickness of 40 μm was adhesively bonded to the second insulating cover layer of the second wired circuit board produced in the manner described above at a front end portion thereof including its surrounding area around the opening corresponding to the first-wired-circuit-board-side terminal portion (Cf. FIG. 5(a)). Then, the first metal substrate of the first wired circuit board was press-bonded to the anisotropic conductive adhesive sheet in the condition that the second-wired-circuit-board-side terminal portion was in alignment and to correspond with the first-wired-circuit-board-side terminal portion, thereby producing the relay flexible wiring circuit board (Cf. FIG. 5(b)).

Example 2

1) Production of First Wired Circuit Board

A first metal substrate of stainless foil having thickness of 25 μm was prepared (Cf. FIG. 6(a)). Then, after solution of polyamic acid resin was applied to a surface of the first metal substrate, the applied resin was exposed to light and developed and thereafter cured by heating, thereby producing the first insulating base layer of polyimide having thickness of 10 μm of a predetermined pattern (Cf. FIG. 6(b)).

Then, a thin chromium film having thickness of 300 Å and a thin copper film having thickness of 800 Å were sequentially formed on the entire area of the first insulating base layer by sputtering, thereby forming a first thin conductor film which serves as a ground layer (Cf. FIG. 6(c)). Thereafter, a first plating resist was formed on a portion of the first thin conductor film corresponding to a reversed portion of a first conductor layer forming portion of the same (Cf. FIG. 6(d)). Then, a first electrolytic plated layer of copper having thickness of 10 μm was formed by electrolytic copper plating on the first thin conductor film exposed from the first plating resist (CF. FIG. 6(e)). Thereafter, the first plating resist was removed by the chemical etching (Cf. FIG. 6(f)). Then, the first thin conductor film on which the first plating resist had been formed was also removed by the chemical etching (Cf. FIG. 6(g)). The first conductor layer comprising the first thin conductor film and the first electrolytic plated layer was formed by this semi-additive process.

Then, after solution of polyamic acid resin was applied to a surface of the first insulating base layer including the first conductor layer, the applied resin was exposed to light and developed and thereafter cured by heating, thereby producing the first insulating cover layer of polyimide having thickness of 3 μm of a predetermined pattern opened at portions thereof corresponding to the suspension-board-side terminal portion and the IC-side terminal portion (Cf. FIG. 6(h)).

Thereafter, a through hole having a diameter of 0.5 mm φ extending through the first insulating cover layer, the first conductor layer, the first insulating base layer and the first metal substrate was formed at a portion corresponding to the second-wired-circuit-board-side terminal portion (Cf. FIG. 6(i)). Thereafter, a preamplifier IC was mounted on the IC-side terminal portion through a connecting pad, thereby producing the first wired circuit board equipped with the preamplifier IC (CF. FIG. 6(j)).

2) Production of Second Wired Circuit Board

A second wired circuit board was produced in the same manner as in Example 1.

3) Production of Flexible Wired Junction Circuit Board

An adhesive sheet of acrylic adhesive having thickness of 25 μm was adhesively bonded to the second insulating cover layer of the second wired circuit board produced in the manner described above at a front end portion thereof including its surrounding area around the opening corresponding to the first-wired-circuit-board-side terminal portion (Cf. FIG. 7(a)). Then, the first metal substrate of the first wired circuit board was press-bonded to the adhesive sheet in the condition that the through hole of the second-wired-circuit-board-side terminal portion was in alignment and to correspond with the first-wired-circuit-board-side terminal portion, thereby connecting together the first wired circuit board and the second wired circuit board (Cf. FIG. 7(b)).

Thereafter, solder cream was filled in the through hole and soldered by reflow soldering to form a solder connecting portion, whereby the relay flexible wiring circuit board was produced wherein the first-wired-circuit-board-side terminal portion of the second wired circuit board and the second-wired-circuit-board-side terminal portion of the first wired circuit board were electrically connected with each other through the solder connecting portion.

Comparative Example 1

Only the second wired circuit board not connected with the first wired circuit board in Example 1 was prepared as a flexible wired junction circuit of Comparative Example 1 (however, this type 1 was equipped with the preamplifier IC and provided with the first-wired-circuit-board-side terminal portion serving as the suspension-board-side terminal portion: any known one of this type may be used).

Evaluation

1) Production of Suspension Board with Circuit

A metal substrate of stainless foil having thickness of 25 μm was prepared (Cf. FIG. 2(a)). Then, after solution of polyamic acid resin was applied to a surface of the metal substrate, the applied resin was exposed to light and developed and thereafter cured by heating, thereby producing the insulating base layer of polyimide having thickness of 10 μm of a predetermined pattern opened at a portion thereof corresponding to the first-wired-circuit-board-side terminal portion (Cf. FIG. 2(b)).

Then, a thin chromium film having thickness of 300 Å and a thin copper film having thickness of 800 Å were sequentially formed on the entire area of the insulating base layer by sputtering, thereby forming a thin conductor film which serves as a ground layer (Cf. FIG. 2(c)). Thereafter, a plating resist was formed on a portion of the thin conductor film corresponding to a reversed portion of a conductor layer forming portion of the same (Cf. FIG. 2(d)). Then, an electrolytic plated layer of copper having thickness of 10 μm was formed by electrolytic copper plating on the thin conductor film exposed from the plating resist (CF. FIG. 2(e)). Thereafter, the plating resist was removed by the chemical etching (Cf. FIG. 2(f)). Then, the thin conductor film on which the plating resist had been formed was also removed by the chemical etching (Cf. FIG. 2(g)). The conductor layer comprising the thin conductor film and the electrolytic plated layer was formed by this semi-additive process.

Then, after solution of polyamic acid resin was applied to a surface of the insulating base layer including the conductor layer, the applied resin was exposed to light and developed and thereafter cured by heating, thereby producing the insulating cover layer of polyimide having thickness of 3 μm of a predetermined pattern opened at a portion thereof corresponding to the magnetic-head-side terminal portion (Cf. FIG. 2(h)).

Thereafter, a portion of the metal substrate corresponding to the first-wired-circuit-board-side terminal portion was chemically etched (Cf. FIG. 2(i)). Then, the magnetic head was mounted on the magnetic-head-side terminal portion through the connecting pad, thereby producing the suspension board with circuit equipped with the magnetic head (Cf. FIG. 2(j)).

Measurement of Characteristic Impedance

Solder bumps were formed on the suspension-board-side terminal portions in the flexible wired junction circuits of Examples and Comparative Example. Then, the flexible wired junction circuits of Examples and Comparative Example were electrically connected to the suspension boards with circuits thus produced via the solder bumps, respectively. Then, the characteristic impedance between the connection point and the magnetic head and the characteristic impedance between the preamplifier IC and the connection point were measured by the time domain reflectometer (TDR) method. The results are shown in TABLE 1.

TABLE 1

|  | Magnetic head - Connection point | Connection point - Preamplifier IC |
|---|---|---|
| Example 1 | 60 Ω | 60 Ω |
| Example 2 | 65 Ω | 65 Ω |
| Comparative Example 1 | 60 Ω | 110 Ω |

It is clearly seen from TABLE 1 that in Examples, no difference was found between both characteristic impedances, so that the matched characteristic impedances were obtained, while on the other hand, in Comparative Example, a significant difference was found therebetween, so that the matched characteristic impedances were not obtained.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board to electrically connect with a suspension board with circuit having a metal substrate, an insulating base layer formed on the metal substrate, a conductor layer formed on the insulating base layer, and an insulating cover layer formed on the conductor layer, the wired circuit board comprising:
   a first wired circuit board electrically connected with the suspension board with circuit, and
   a second wired circuit board electrically connected with the first wired circuit board, for electrical connection with an external circuit,
   wherein the first wired circuit board includes a first metal substrate, a first insulating base layer formed on the first metal substrate, a first conductor layer formed on the first insulating base layer, and a first insulating cover layer formed on the first conductor layer.

2. The wired circuit board according to claim 1, wherein the conductor layer of the suspension board with circuit and the first conductor layer of the first wired circuit board are formed by a semi-additive process.

3. The wired circuit board according to claim 1, wherein the conductor layer of the suspension board with circuit and the first conductor layer of the first wired circuit board are substantially equal in thickness to each other.

4. The wired circuit board according to claim 1, wherein the insulating base layer of the suspension board with circuit and the first insulating base layer of the first wired circuit board are substantially equal in thickness to each other.

5. The wired circuit board according to claim 1, wherein the insulating cover layer of the suspension board with circuit and the first insulating cover layer of the first wired circuit board are substantially equal in thickness to each other.

* * * * *